(12) United States Patent
Downey

(10) Patent No.: US 7,821,625 B2
(45) Date of Patent: Oct. 26, 2010

(54) SYSTEMS AND METHODS FOR LITHOGRAPHIC ILLUMINATOR BEAM DEVIATION MEASUREMENT AND CALIBRATION USING GRATING SENSORS

(75) Inventor: Todd R. Downey, Monroe, CT (US)

(73) Assignee: ASML Holding N.V., Veldhoven (NL)

(*) Notice: Subject to any disclaimer, the term of this patent is extended or adjusted under 35 U.S.C. 154(b) by 128 days.

(21) Appl. No.: 12/341,095

(22) Filed: Dec. 22, 2008

(65) Prior Publication Data

US 2009/0161093 A1 Jun. 25, 2009

Related U.S. Application Data

(60) Provisional application No. 61/016,287, filed on Dec. 21, 2007.

(51) Int. Cl.
*G01C 1/00* (2006.01)
(52) U.S. Cl. .................. 356/139.05; 356/139.01; 356/139.1
(58) Field of Classification Search .. 356/139.01–139.1
See application file for complete search history.

(56) References Cited

U.S. PATENT DOCUMENTS

| 5,598,267 | A | 1/1997 | Sambles et al. | |
|---|---|---|---|---|
| 2005/0099622 | A1* | 5/2005 | Caracci et al. | 356/300 |
| 2007/0252967 | A1 | 11/2007 | Bleeker et al. | |
| 2008/0062418 | A1* | 3/2008 | Magnusson et al. | 356/307 |

OTHER PUBLICATIONS

Homola et al., "Surface plasmon resonance sensors based on diffraction gratings and prism couplers: sensitivity comparison", *Sensors and Actuators B: Chemical*, vol. 54, Issues 1-2, Jan. 25, 1999, pp. 16-24.

Homola, Jiří, "On the sensitivity of surface plasmon resonance sensors with spectral interrogation" *Sensors and Actuators B: Chemical*, vol. 41, Issues 1-3, Jun. 30, 1997, pp. 207-211.

Lawrence et al., "Surface plasmon resonance studies of immunoreactions utilizing disposable diffraction gratings", *Biosens. Bioelectron*, 11, 389-400, 1996.

Richi et al., "Surface-Plasmon Resonance Effect in Grating Diffraction", *Phys. Rev. Lett.* 21, 1530, 1968.

Cowan et al., "Dispersion of surface plasmons in dielectric-metal coatings on concave diffraction gratings", *Z. Phys.* 235, 97, 1970.

Palik, E. D., *Handbook of Optical Constants of Solids*. Boston, MA: Academic, 1985, pp. 275-367, 396-406, 680-693, and 753-763.

Raether, H., *Surface Plasmon on Smooth and Rough Surfaces and on Gratings*, Springer Tracts in Modern Physics. vol. 111, Berlin, Germany: Springer-Verlag, 1988, Chapter 6, pp. 91-116.

* cited by examiner

*Primary Examiner*—Thomas H Tarcza
*Assistant Examiner*—Luke D Ratcliffe
(74) *Attorney, Agent, or Firm*—Sterne, Kessler, Goldstein & Fox P.L.L.C

(57) ABSTRACT

Angular deviation of illumination beam is measured with high accuracy for an expanded continuous range of angles using grating sensors that are configured to exhibit Surface Plasmon Resonance effects at actinic wavelengths. The beam deviation measurement systems and procedures are applicable to both mask-based and maskless lithography tools. A control system adopts an appropriate calibration algorithm based on whether the SPR effect is detected or not. Relative intensity shift in an SPR-affected diffractive order, and/or relative position and slope change in non-SPR-affected diffractive orders are used as a basis of the adopted calibration algorithm.

21 Claims, 15 Drawing Sheets

SYSTEMS AND METHODS FOR LITHOGRAPHIC ILLUMINATOR BEAM DEVIATION MEASUREMENT AND CALIBRATION USING GRATING SENSORS

CROSS REFERENCE TO RELATED APPLICATIONS

This application claims the benefit under 35 U.S.C. §119 (e) to U.S. Provisional Patent Application 61/016,287 filed Dec. 21, 2007, which is incorporated herein by reference in its entirety.

BACKGROUND

1. Field of the Invention

This invention relates to systems and methods for measuring radiation beam deviation in general, and particularly, in lithographic apparatus.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), and other devices involving fine structures.

In some lithographic apparatus, a patterning device, which is alternatively referred to as a mask or a reticle, may be used to generate a circuit pattern to be formed on an individual layer of the substrate. This pattern can be transferred onto a target portion (e.g., comprising part of, one, or several dies) on a substrate (e.g., a semiconductor wafer). The lithographic apparatus comprises an illumination system to illuminate the mask and a projection system (also referred to as a projection lens) to transfer the mask's pattern, via imaging, onto a layer of radiation-sensitive material (photo-resist) provided on the substrate. In general, a single substrate will contain a network of adjacent target portions that are successively patterned.

Instead of a mask, in some lithographic apparatus, the patterning device can be a patterning array that comprises one or more arrays of individually controllable elements. Sometimes, the pattern can be changed more efficiently in a maskless system compared to a mask-based system. These types of apparatus are referred to as Optical Maskless Lithographic (OML) apparatus.

Known lithographic apparatus include so-called steppers or step-and-repeat apparatus, and so-called scanners or step-and-scan apparatus. In a stepper each target portion is irradiated by exposing an entire pattern onto the target portion at one time, and the wafer is moved by a predetermined amount to a next position for a subsequent exposure. In a scanner, each target portion is irradiated by scanning the pattern through a beam of radiation in a given direction (the "scanning"-direction) while synchronously scanning the substrate parallel or anti-parallel to this direction, and next the wafer is moved to a next position for a subsequent exposure.

In order to achieve optimum performance in a mask-based or OML apparatus, proper positioning and pointing of the illuminator beam is important. Conventionally, large optical systems (including lenses and mirrors) and detectors are used to measure deviation of the beam from its desired position and pointing. Typically, beam steering mirrors and other mechanisms adjust the beam to bring it back within an allowed range of position and pointing values, if the beam shifts outside the allowed range due to some reason. One such conventional large optical system is known as a Beam Measuring Unit ("BMU"). A BMU is not only large in size, it also has the additional limitation of wavelength dependence. A BMU designed for a particular actinic wavelength may not be suitable for another specific actinic wavelength or wavelength range. For example, a BMU designed for 248 nm actinic wavelength uses a 633 nm wavelength red laser for non-actinic measurement and calibration for practical advantages, because 633 nm is visible (248 nm is not) and requires less safety precautions. However, the same measurement and calibration data can not be used for an actinic wavelength of 193 nm, as refractive indices of lenses within the BMU are wavelength-dependent. Thus, significant design changes are needed for a BMU that would work for the 193 nm actinic wavelength.

There are additional limitations in the conventional beam deviation measurement systems. Usually, angular displacement sensors are located within the illuminator to measure beam deviation. Depending on the location of the angular displacement sensor within an illuminator, the effects of pulse polarization state, angular misalignments of detectors, and variation in laser pulse energy and wavelength may greatly affect the accuracy and precision of the calculated angular deviation of the beam. These effects become more significant for conventional beam deviation measurement systems, as those systems may not be positioned at an optimum location due to their large size. Moreover, the measurement range of conventional detectors is limited to portions of the entire required range. Most of the conventional detectors work better for larger deviations, but lose accuracy for smaller deviations. On the other hand, highly sensitive detectors that work well for the smallest deviations have zero or minimal sensitivity for larger deviations, because variations of the spread of angular deviation about a nominal deviation confound sensitive detectors that assume a collimated input.

SUMMARY

What are needed are versatile systems and methods for measuring a wide range of illuminator beam deviation with a high accuracy without taking too much space within a lithographic apparatus. Embodiments of the present invention employ grating-based sensors in lithographic apparatus to measure beam deviation.

In an embodiment of the present invention, an optical system includes an aperture through which at least a portion of a beam of radiation passes to produce an incident beam directed towards a grating sensor, wherein the grating sensor is configured to produce surface plasmon resonance (SPR) effects at a suitable wavelength range of the beam of radiation. The system also includes a set of detection elements, each element receiving a portion of a respective beam diffracted from the grating sensor, each diffracted beam corresponding to a diffractive order. A transducer coupled to the set of detection elements normalizes a measured intensity data for each diffractive order with respect to a reference beam intensity measured by a reference energy sensor. A processor coupled to the transducer determines if a characteristic loss of intensity caused by SPR is detected and adopts an appropriate calibration algorithm to quantify angular deviations of the beam of radiation by analyzing normalized intensity data for each diffractive order. An output indicator coupled to the processor communicates an output to facilitate monitoring and calibration of the illuminating beam.

Embodiments of the present invention enable angular deviation measurement of illumination beam with high accuracy for an expanded continuous range of angles. The measurement system and procedure are applicable to both mask-based and maskless lithography tools. Additionally, embodiments of the present invention enables beam deviation measurement at actinic wavelengths.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
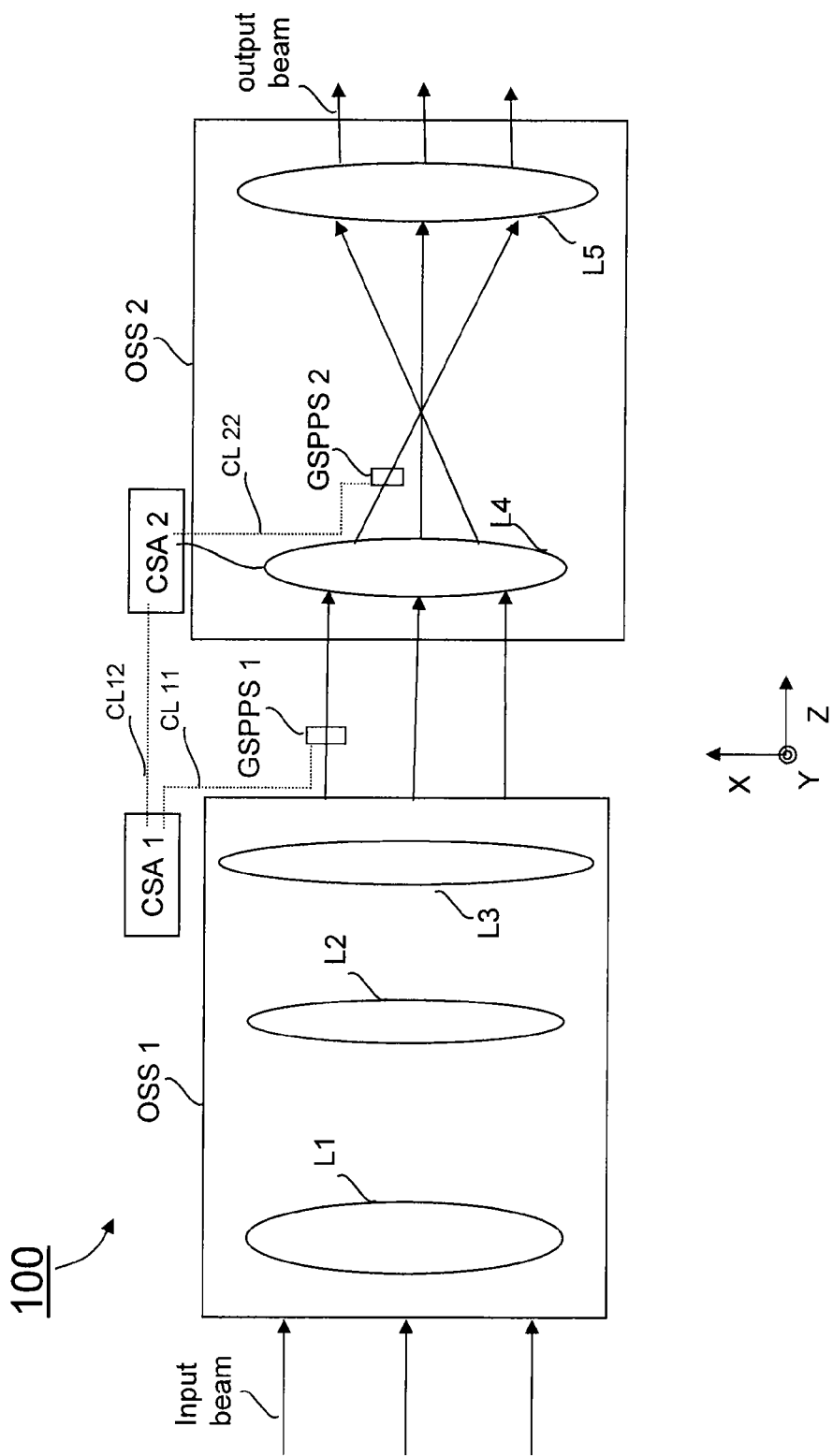
FIG. 1 shows a generic optical system including grating sensors.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

As discussed above, measurement of illuminating beam deviation and calibration and correction of the positioning of the illuminating beam is important to evaluate overall performance of a lithographic apparatus. This specification discloses one or more embodiments that employ grating based sensors in lithographic apparatus to measure beam deviation with high accuracy for both small and large angular deviation ranges.

The disclosed embodiment(s) merely exemplify the invention. The scope of the invention is not limited to the disclosed embodiment(s). The invention is defined by the claims appended hereto.

The embodiment(s) described, and references in the specification to "one embodiment" "an embodiment," "an example embodiment," etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 3:
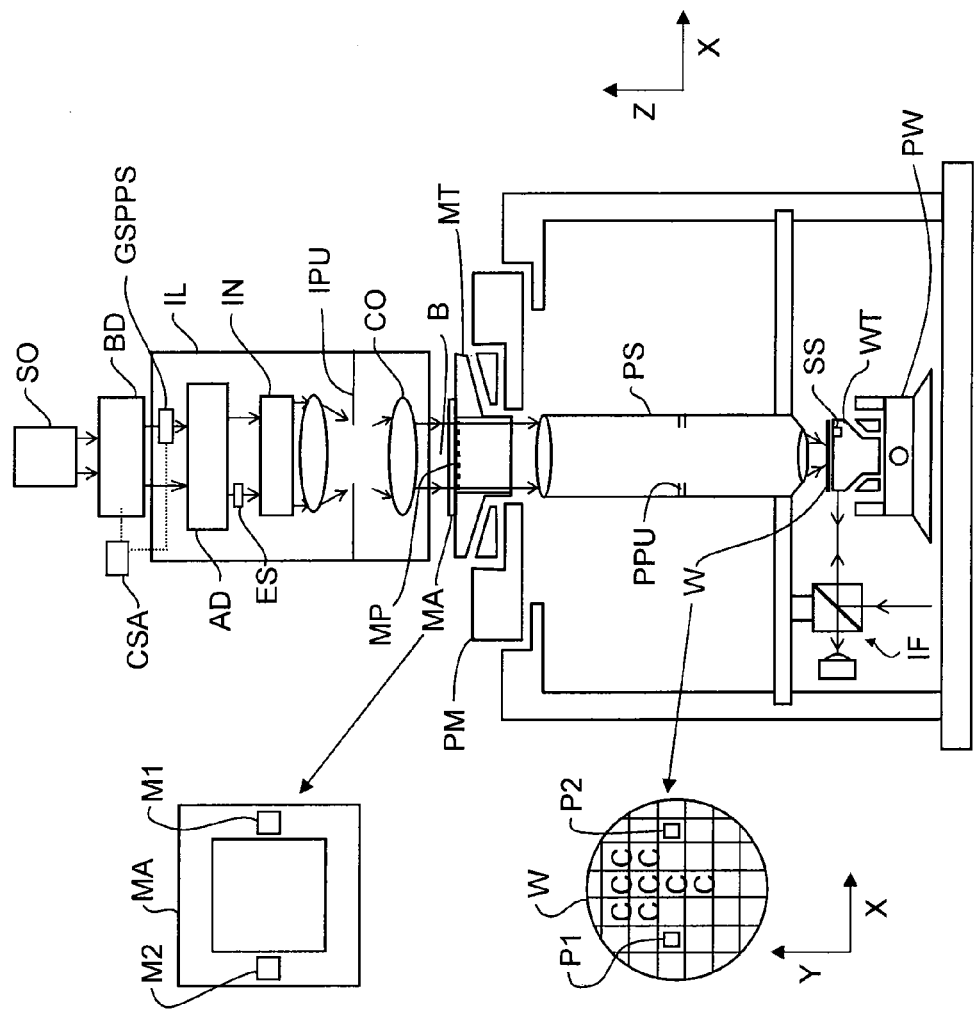
FIG. 3 shows a mask-based lithographic apparatus according to an embodiment of the invention.
Figure 4:
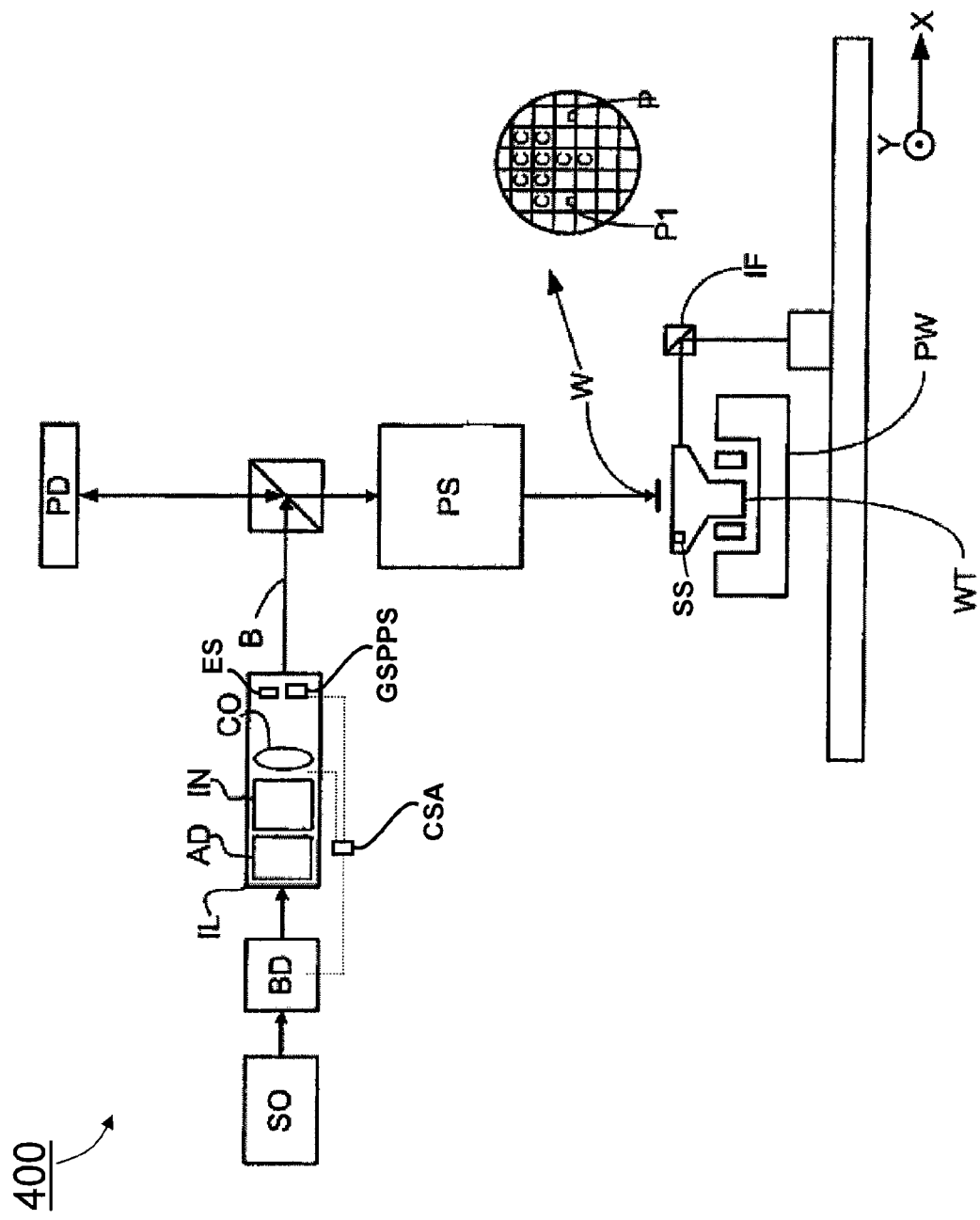
FIG. 4 depicts an optical maskless lithographic apparatus, according to an embodiment of the present invention.

In the following sections, FIGS. 1, 3, and 4, and related description discuss various optical systems where embodiments of the present invention may be used to measure beam deviation. FIG. 1 depicts a generic optical system equipped with beam deviation measurement facility. FIG. 3 depicts a reticle-based or mask-based lithographic (MBL) apparatus where one embodiment of the invention can be used. FIG. 4 depicts an OML apparatus where another embodiment of the invention can be used.

1. Grating Sensor in a Generic Optical System

Optical system 100 in FIG. 1 shows two example locations of grating sensors for beam deviation measurement. The sensors are called Grating Surface Plasmon Pointing Sensor (GSPPS). GSPPS sensors are configured to use the Surface Plasmon Resonance (SPR) effect to calculate beam deviation. However, GSPPS sensors are not limited to the use of SPR only. GSPPS sensors are configured to calculate beam deviation based on alternative calibration algorithms as well. For example, position and slope measurement of diffracted beam intensity may be a basis of a non-SPR-dependent calibration algorithm. Other types of grating-based sensors may be employed as well.

The generic optical system 100 comprises at least two optical sub-systems: OSS 1 and OSS 2. OSS 1 receives an input beam of radiation. OSS 1 comprises one or more beam shaping and directing components along an optical path, such as the example lenses L1, L2, and L3. OSS 2 also comprises one or more beam shaping and directing components along the optical path, such as the example lenses L4 and L5. Optical system 100 may include intra-subsystem and/or inter-subsystem grating sensors. For example, a first GSPPS, denoted as GSPPS 1, interrogates a portion of the beam in between the subsystems OSS 1 and OSS 2. Another GSPPS, denoted as GSPPS 2, interrogates a portion of the beam within OSS 2. GSPPS 1 and GSPPS 2 are coupled to their respective control systems, CSA 1 and CSA 2 via communication links CL 11 and CL 22, respectively. CSA 1 and CSA 2 may be coupled to each other via another link CL 12. The GSPPS measurements are used by the control systems (CSA 1 and CSA 2) to make corrections to the intra-subsystem and inter-subsystem angular deviations, respectively, by driving actuators that either move the entire subsystem(s) or individual element(s) within the subsystem(s), so that the output beam has desired positioning and pointing.

Details of GSPPS configurations are discussed below with reference to FIGS. 2A-2C.

1.1 Grating Sensor in a Mask-Based Lithographic Apparatus

FIG. 3 shows a mask-based lithographic apparatus 300 with a GSPPS located within an illuminator, according to an embodiment of the present invention. The mask-based lithographic apparatus 300 comprises:

- an illumination system IL configured to condition a radiation beam B (e.g., a beam of Ultra-Violet (UV) radiation as provided by a mercury arc lamp, or a beam of Deep Ultra-Violet (DUV) radiation generated by a Krypton Fluoride (KrF) excimer laser, an Argon Fluoride (ArF) excimer laser, or the like);
- a support structure (e.g., a mask table) MT constructed to support a patterning device (e.g., a mask) MA having a mask pattern MP and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by the pattern MP of the patterning device MA onto a target portion C (e.g., comprising one or more dies) of the substrate W.

The illumination system may include various types of optical components, such as refractive, reflective, and diffractive types of optical components, or any combination thereof, for directing, shaping, or controlling radiation.

The support structure supports, i.e., bears the weight of, the patterning device. The support structure holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern MP includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 3, the illumination system IL receives a radiation beam from a radiation source SO, such as for example a mercury-arc lamp for providing g-line or i-line UV radiation, or an excimer laser for providing DUV radiation of a wavelength of less than about 270 nm, such as, for example 248, 193, 157, 126, 13.5, and 11 nm. The source and the lithographic apparatus may be separate entities, for example when the source is an excimer laser. In such cases, the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system can be adjusted. In addition, the illumination system IL may comprise various other components, such as an integrator IN and a condenser CO. The illumination system may be used to condition the radiation beam, to have a desired uniformity and intensity distribution in its cross-section at mask level.

The GSPPS is located within the illumination system IL in between the beam delivery system BD and the beam adjuster AD. The GSPPS interrogates a portion of the beam. Note that the GSPPS location is not limited to the location shown in FIG. 3, and the GSPPS may be located at other locations within the illuminator. Intensity data from the GSPPS goes to a control system CSA, which calculates beam deviation, and controls the beam delivery system to bring the beam B back to its intended nominal or undeviated position. Also included in the illumination system IL is an energy sensor ES. ES measures a reference beam intensity. Data from ES is used to normalize GSPPS intensity data. A signal path may go from ES to CSA, or from ES to GSPPS.

The radiation beam B is incident on the patterning device (e.g., mask MA), which is held on the support structure (e.g., mask table MT), and is patterned by the patterning device in accordance with a pattern MP. Having traversed the mask MA, the radiation beam B passes through the projection system PS, which focuses the beam onto a target portion C of the substrate W.

The projection system has a pupil IPU conjugate to the illumination system pupil IPU, where portions of radiation emanating from the intensity distribution at the illumination system pupil IPU and traversing a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 3) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Substrate table WT may include a spot sensor SS. Spot sensor SS uses data from energy sensor ES to normalize exposure dose.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

1.2 Grating Sensor in Maskless Lithographic Apparatus

FIG. 4 depicts an OML apparatus 400 where another embodiment of the invention can be used. The apparatus in FIG. 4 comprises an illumination system IL, a patterning device PD, a substrate table WT, and a projection system PS. The illumination system (illuminator) IL is configured to condition a radiation beam B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the one or more arrays of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD is one or more arrays of individually controllable elements that modulate the beam.

An array of individually controllable elements is also known as a Spatial Light Modulator or SLM. There may be more than one SLMs in a lithographic apparatus. For example, in an embodiment of an OML apparatus, 14 SLMs are used in a two-row configuration. In general, the position of a SLM will be fixed relative to the projection system PS. However, it can instead be connected to a positioner configured to accurately position the SLM in accordance with certain parameters.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

The lithographic apparatus can comprise one or more contrast devices. For example, it can have a plurality of SLMs, each element of which is controlled independently of each other. In such an arrangement, some or all of the SLMs can have at least one of a common illumination system (or part of an illumination system), a common support structure for the SLMs, and/or a common projection system (or part of the projection system).

In one example, the substrate W is a wafer, for instance a semiconductor wafer. The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the SLMs, such that the pattern is coherently formed on the substrate. Alternatively, the projection system can image secondary sources for which the elements of the SLMs act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of elements in SLMs in the patterning device is equal to or greater than the number of focusing elements in the array of focusing elements. One or more (e.g., 1,000 or more, the majority, or each) of the focusing elements in the array of focusing elements can be optically associated with one or more of the individually controllable SLM elements, with 2 or more, 3 or more, 5 or more, 10 or more, 20 or more, 25 or more, 35 or more, or 50 or more of the individually controllable SLM elements.

The MLA can be movable (e.g., with the use of one or more actuators) at least in the direction to and away from the substrate. Being able to move the MLA to and away from the substrate allows, e.g., for focus adjustment without having to move the substrate.

As herein depicted in FIG. 4, the apparatus is of a reflective type (e.g., employing a reflective SLM). Alternatively, the apparatus can be of a transmission type (e.g., employing a transmission SLM).

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 4, the illuminator IL receives a radiation beam from a radiation source SO. The radiation source provides radiation having a wavelength of at least 5 nm, at least 10 nm, at least 11-13 nm, at least 50-nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360=n, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm or even shorter wavelengths.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable SLM elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

Illumination system IL includes GSPPS and energy sensor ES. In FIG. 4, the GSPPS is shown at a representative location within the IL. The GSPPS interrogates a portion of the beam, or, optionally, a set of the sub-beams formed within the IL, potentially just after the CO. Note that GSPPS may be located elsewhere in the system.

A control system CSA coupled to the GSPPS calculates beam deviation, and adjusts either the beam delivery system BD or some optical components within the illuminating system IL, or both, to bring the beam back to a nominal position.

The radiation beam B is incident on the patterning device PD (e.g., one or more SLMs) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the SLM can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 4. In another example, a short stroke stage cannot be present. A similar system can also be used to position the SLMs. It will be appreciated that the beam B can alternatively/additionally be moveable, while the object table and/or the SLMs can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity. Substrate table WT may include a spot sensor SS. Spot sensor SS uses data from energy sensor ES to normalize exposure dose.

As shown in FIG. 4, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 4 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 4 cannot be required if a transmission patterning device is used.

The depicted apparatus in FIG. 4 can be used in several modes:

1. In step mode, the SLMs and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the SLMs and the substrate are scanned synchronously while a pattern imparted to the radiation beam is projected onto a target portion C (i.e., a single dynamic exposure). The velocity and direction of the substrate relative to the SLMs can be determined by the (de-) magnification and image reversal or image mirroring characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the SLMs are kept essentially stationary and the entire pattern is projected onto a target portion C of the substrate W using a pulsed radiation source. The substrate table WT is moved with an essentially constant speed such that the beam B is caused to scan a line across the substrate W. The pattern on the SLMs is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the SLMs is updated as the beam B scans across the substrate W and exposes it. A substantially constant radiation source or a pulsed radiation source, synchronized to the updating of the pattern on the SLMs, can be used.

5. In pixel grid imaging mode (not shown), the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the SLM elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable SLM elements to provide a zero or significantly lower radiation intensity.

In one example, a positioning device (not shown) for a pupil plane array of individually programmable elements can be used to accurately correct the position of pupil plane array of individually programmable elements with respect to the path of beam B, e.g., during a scan. In one embodiment in which reflective device PD also comprises a array of individually programmable elements ("object plane array of individually programmable elements"), a second positioning device (not shown) can be used to accurately correct the position of object plane array of individually programmable elements PD with respect to the path of beam B.

In another example, movement of substrate table WT is realized with the aid of a long-stroke module (course positioning) and a short-stroke module (fine positioning), which are not explicitly depicted in FIG. 4. A similar system can also be used to position pupil plane array of individually programmable elements and/or patterning device PD. It will be appreciated that beam B may alternatively/additionally be moveable, while substrate table WT and/or pupil plane array of individually programmable elements and/or object plane array of individually programmable elements PD (when applicable) may have a fixed position to provide the required relative movement.

Although specific reference may have been made above to the use of embodiments of the invention in the context of mask-based or maskless optical lithography, it will be appreciated that the invention may be used in other applications. For example, embodiments of the present invention are equally applicable to mask-based or maskless lithographic apparatus, adapted to support immersion lithography.

The descriptions above are intended to be illustrative, not limiting. Thus, it will be apparent to one skilled in the art that modifications may be made to the invention as described without departing from the scope of the claims set out below. For some optical systems, multiple GSPPS sensors positioned at various locations within the system may be advantageous. For example, in the mask-based lithography apparatus of FIG. 3, possible locations for a GSPPS are in between the SO and the BD, within the BD, in between the BD and the IL, or any location within the IL. Any combination of the above set of locations may be appropriate too. For both MBL and OML tools, the alignment of each of the sub-modules of the IL, the alignment of the IL and other modules including the BD, and the associated tolerances for each module w.r.t. angular beam deviation may dictate the number of required GSPPS and their locations. In this respect, a set of GSPPSs within the BD, a set within the IL, and, potentially, a set elsewhere within the tool may be required in either case. In general, a GSPPS may be placed after every/any optical element.

2. Configurations of Grating Sensors

The grating sensors receive a beam of illuminator light that is vignetted by one or more holes in an aperture. Light beams emanating from the holes in the aperture are incident on one or more gratings that diffract portions of the beam onto a set of detection elements corresponding to each grating. In some embodiments, a discrete number of gratings are used. For example, N number of aperture holes direct N number of light beams to N number of gratings. Each of the N gratings has a corresponding detector, each with a set of P detection elements. Thus, an entire GSPPS system with N gratings has a total of P×N number of detection elements. FIGS. 2A and 2B show two exemplary GSPPS configurations where N=4. Other numbers of N are possible.

In an alternative embodiment, a continuous grating and a continuous detector may be used. In this case, N approaches infinity. FIG. 2C shows such a configuration.

Figure 2A:
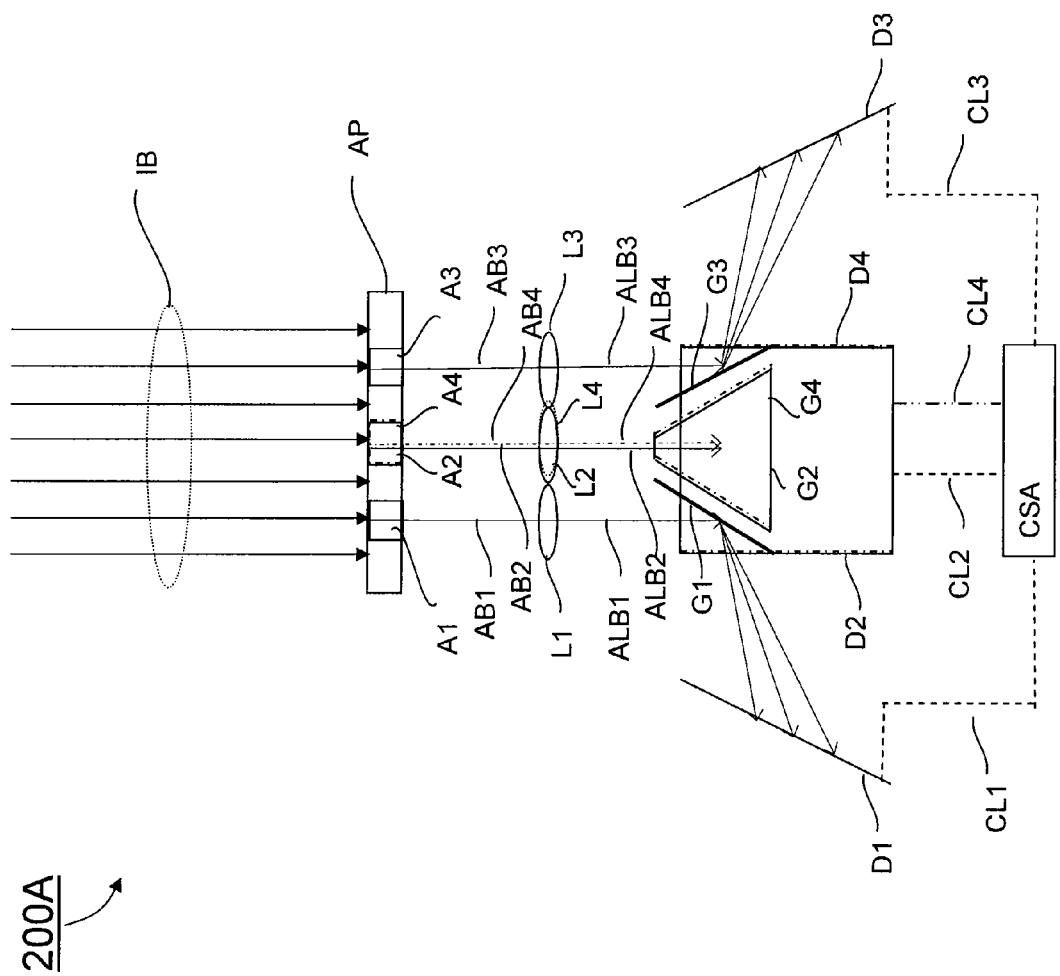
FIGS. 2A-2C show three different arrangement of grating sensors and detectors, according to embodiments of the present invention.

FIG. 2A shows a four-grating GSPPS configuration 200A, where the gratings G1-G4 are reflective gratings. Diffracted beams from only 2 of the 4 reflective gratings are shown for clarity. Components of each of the four optical channels (comprising an aperture hole, a lens, a grating, a detector, and a communication link to a control system) are numbered starting from the left side of the figure with channel 1 and ends with channel 4. Channel 4 components are behind channel 2 components. For clarity, channel 4 components are drawn with dot-dash-dot lines.

Gratings G1-G4 may have a truncated pyramidal shape, though the present invention is not limited to the truncated pyramidal shape of the gratings. Additionally, G1-G4 does not have to be identical to each other.

In FIG. 2A, an illumination beam (IB) passes through an aperture plate AP, comprising four aperture holes A1-A4, and a set of four apertured beams AB1-AB4 is created. Optionally, a set of lenses L1-L4 may be placed after the aperture plate AP to form a set of four apertured and lensed beams ALB1-ALB4. ALB1-ALB4 are shrunk, expanded, collimated and/or deflected modifications of the apertured beam set AB1-AB4. ALB1-ALB4 propagate toward each respective grating (G1-G4). A set of M diffracted beams representing M diffractive orders from each grating are incident on a respective set of detectors D1-D4. Each of D1-D4 has P number of detection elements, where P>M. Typically, P>>M, so that each diffractive order is resolved by many detecting elements. Note that the set of M diffractive order beams are not specifically called-out with labels in the figure, and that the diffractive order beams emanating from G2 and G4 are not shown for clarity.

Detectors D1-D4 may have CCD-based or other type of detection elements sensitive to the actinic wavelength of light. Detectors D1-D4 are positioned in planes so that they collect all diffractive orders from the respective gratings G1-G4. Signals from detectors D1-D4 are normalized with respect to a reference beam intensity by a transducer, and are transferred to a control system CSA via communication links (CL1-CL4). Control system CSA may include a processor that uses an appropriate calibration algorithm to quantify angular deviations of the beam of radiation by analyzing normalized intensity data for each diffractive order. CSA may also be coupled to a beam position controller (not shown).

Figure 2B:
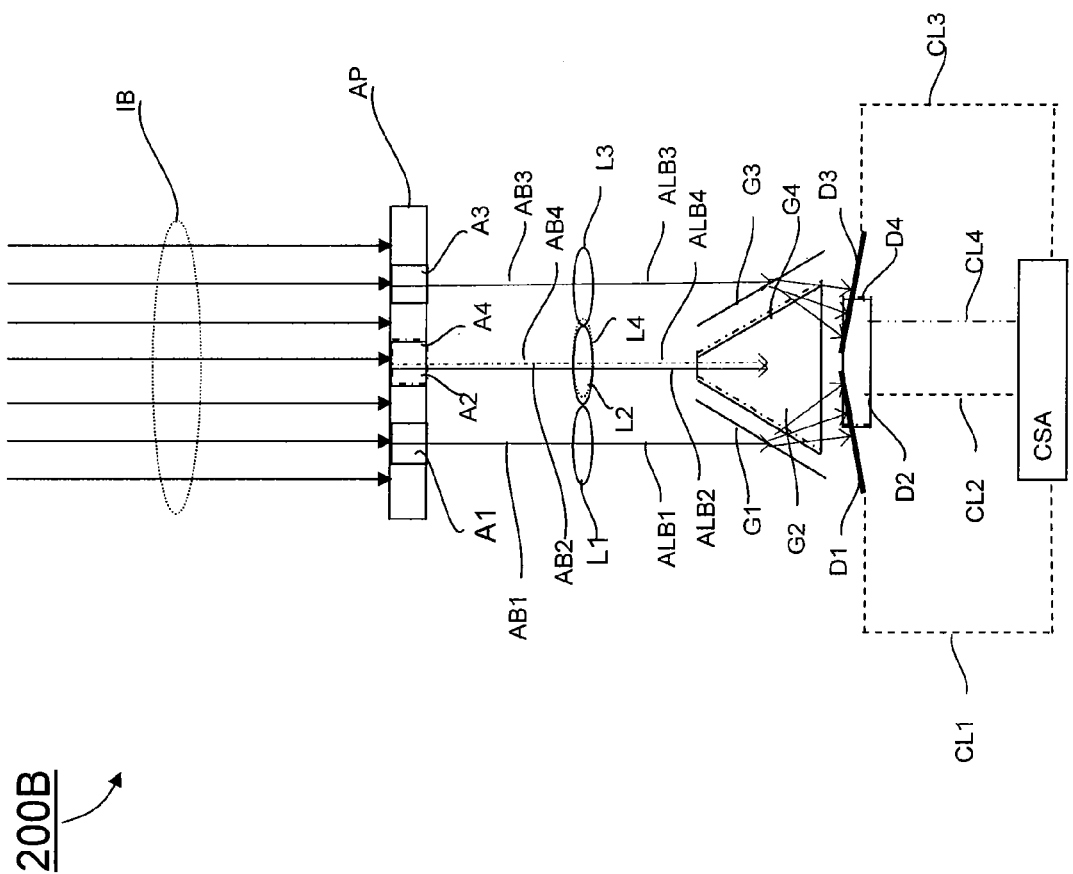

FIG. 2B shows a four-grating GSPPS configuration 200B, where the gratings G1-G4 are transmissive gratings. For FIG. 2B, the same discussion from FIG. 2A applies except that the gratings are transmissive, and positions of the detectors D1-D4 are modified due to the different propagation directions of the diffractive orders. Detectors D1-D4 have substantially different tilt with respect to illuminating beam IB, as shown in FIG. 2B.

Figure 2C:
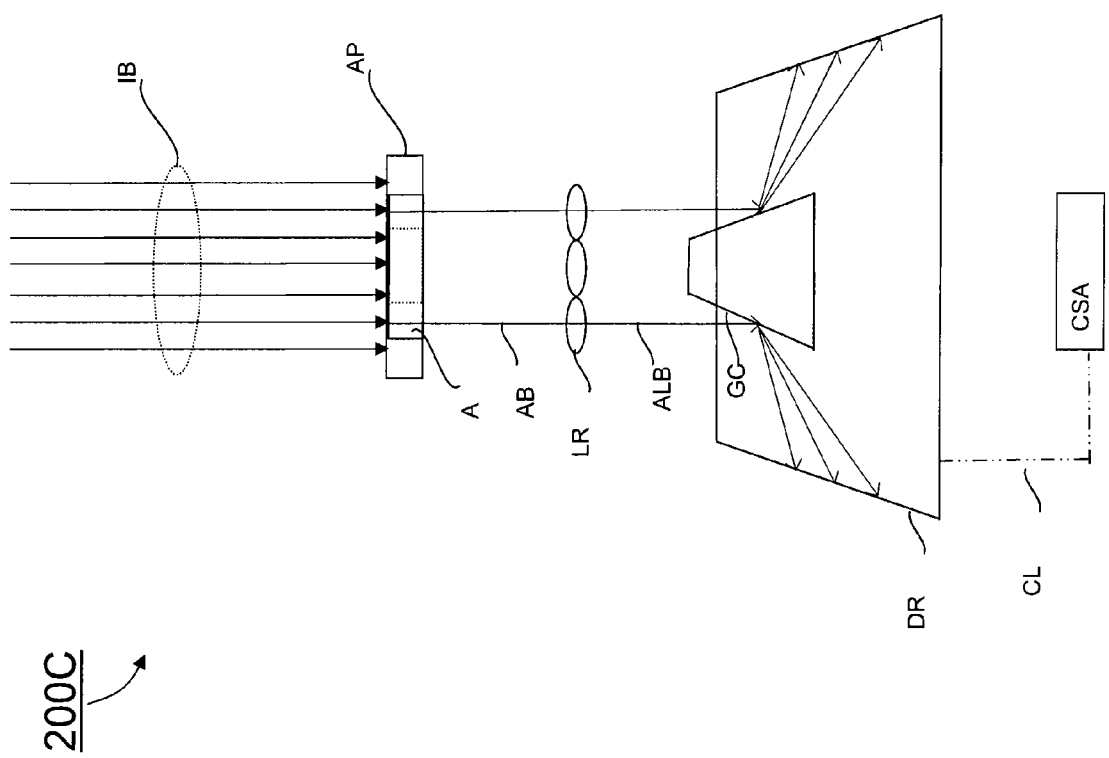

FIG. 2C shows an embodiment 200C that employs a continuous reflective grating instead of using discrete gratings. For FIG. 2C, an aperture plate AP comprises an annular aperture A forming an annular beam AB. The four optional lenses L1-L4 in FIGS. 2A-2B are replaced by an optional ring-array of lenses LR forming a modified annular lensed beam ALB. The grating G is in the shape of a truncated cone with concentric grating lines produced around each circumferential slice of the cone. A detector ring DR concentric with the grating G is used to collect diffractive order beams. A single communication link CL connects the control system CSA with the detector ring DR.

As would be obvious to a person having ordinary skill in the art, in FIG. 2C, diffractive order beams hit the DR from all angles (i.e., all around the detector ring), but, for clarity, only the diffractive orders going to the right and to the left are shown.

2.1 Surface Plasmon Resonance in Grating Sensors

As mentioned earlier, GSPPS sensors are configured to utilize SPR effects to measure beam deviation for calibration and correction purposes. SPR is characterized by a loss of reflected or transmitted intensity from a grating surface because of resonant absorption of light due to surface plasmon (SP) excitation. SP excitation occurs at an incident angle $\theta_{sp}$ on a grating that comprises an interface of wavelength-appropriate metal and dielectric materials. Incident angle $\theta_{sp}$ given by Eq. 1 below:

$$k_x = k_{sp} = \left(\frac{2\pi}{\lambda_a}\right)\sqrt{\varepsilon_d}\sin(\theta_{sp}) + \left(\frac{2\pi}{\Lambda}\right)m \quad \text{(Eq. 1)}$$

Where:

$k_x$ is the x component for the propagation constant of an incoming laser pulse,
$k_{sp}$ is the propagation constant for the SP along the interface,
$\lambda_a$ is the actinic wavelength of the laser,
$\varepsilon_d$ is the value of the dielectric function at $\lambda_a$,
$\theta_{sp}$ is the surface plasmon coupling angle,
m is the set of grating diffraction orders, and
$\Lambda$ is the grating period.

The relationship for the metal and dielectric materials that will lead to SP excitation at $\lambda_a$, is given by Eq. 2:

$$k_x = k_{sp} \cong \left(\frac{2\pi}{\lambda_a}\right)\sqrt{\frac{\varepsilon_m \varepsilon_d}{(\varepsilon_m + \varepsilon_d)}} \quad \text{(Eq. 2)}$$

where $\varepsilon_m$ is the real part of the dielectric function, namely $\varepsilon_m = \sqrt{n^2 k^2}$, with n and k being the values of the real and imaginary parts, respectively, of the index of refraction for the metal evaluated at $\lambda_a$.

Equating the left-hand sides of Eq. 1 and Eq. 2 leads to the fundamental relationship between the grating parameters, material characteristics and the incident angle.

$$\sqrt{\frac{\varepsilon_m \varepsilon_d}{(\varepsilon_m + \varepsilon_d)}} = \sqrt{\varepsilon_d} \sin(\theta_{sp}) + \left(\frac{\lambda_a}{\Lambda}\right)m \quad \text{(Eq 3)}$$

In embodiments of the present invention, smaller angular beam deviations are captured by intensity analysis. For example, single laser pulses incident at $\theta=\theta_{sp}$ produces diffracted aperture images with the lowest intensity, because of resonant absorption due to coupling into SPs. Angular deviations about $\theta_{sp}$ produces diffracted aperture images with relatively higher intensity. The smallest resolvable deviation is limited primarily by detector characteristics, especially noise. Large angular beam deviations (e.g., $(|\theta-\theta_{sp}|) \geq 0.001°$) that completely remove SPR effects can be captured by analysis of the large shift in the position of the higher diffracted orders.

Many different metals can be used for SP excitation at the actinic wavelengths of illuminators, including 193 nm. Gold may be used due to its relatively high level of resistance to oxidation, as compared to other metals. However, aluminum is also used in a number of embodiments. Similarly, a number of different dielectrics may be used as the substrate material for the gratings. Some of the example dielectrics are silicon dioxide and fluoride-based materials. Many different metal-dielectric combinations may be used. One example embodiment may use aluminum as the metal and silicon dioxide as the dielectric substrate, but the present invention is not limited to any particular combination of metal and dielectric.

2.2 Polarization Consideration

As discussed above, a beam deviation measurement system may include N number of discrete gratings. Though N can be any number, there are certain advantages of using an even number of gratings, i.e., N/2 pairs of gratings. When N/2 pairs of gratings are used, each pair of gratings has a complementary second pair of gratings rotated $(360/N)°$ from itself about a central point. For example, when N=4, i.e., two pairs of gratings are used (as shown in FIGS. 2A and 2B), one pair of gratings is tilted in opposite directions about a central point, and a complementary pair of gratings is placed rotated at an angle of 90° from the first pair.

For a particular polarization-mode, at least one pair, or, potentially, a single grating, will provide accurate information. The polarization-mode change effects must also be incorporated into the calibration procedure to avoid measurement errors. The entire set of possible polarization modes dictates the choice of N for a particular application of a GSPPS in a particular optical system.

3. Methods of Beam Deviation Measurement

Figure 5:
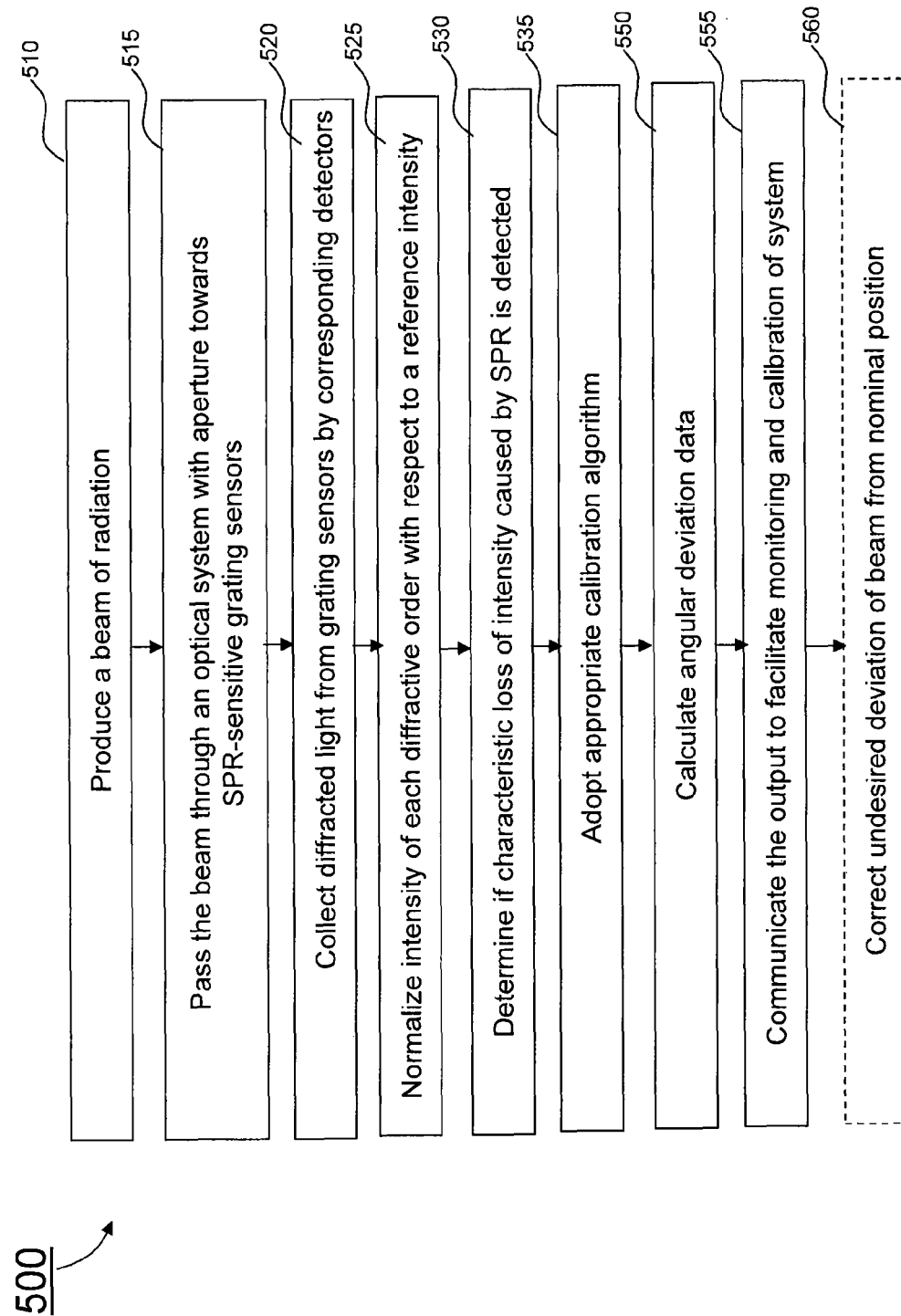
FIGS. 5, 6A and 6B show flowcharts listing example method steps performed in accordance with embodiments of the present invention.
Figure 6A:
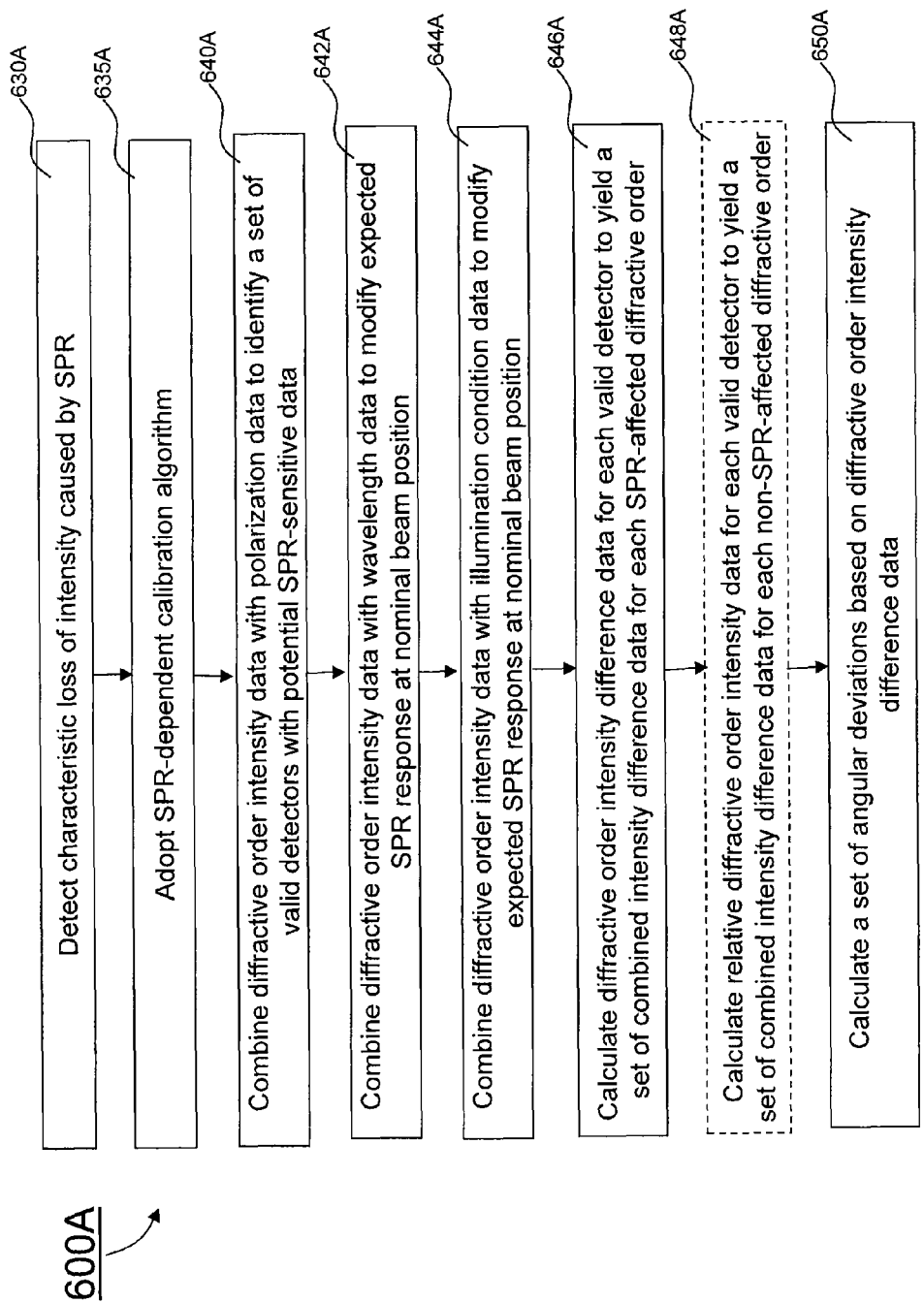
Figure 6B:
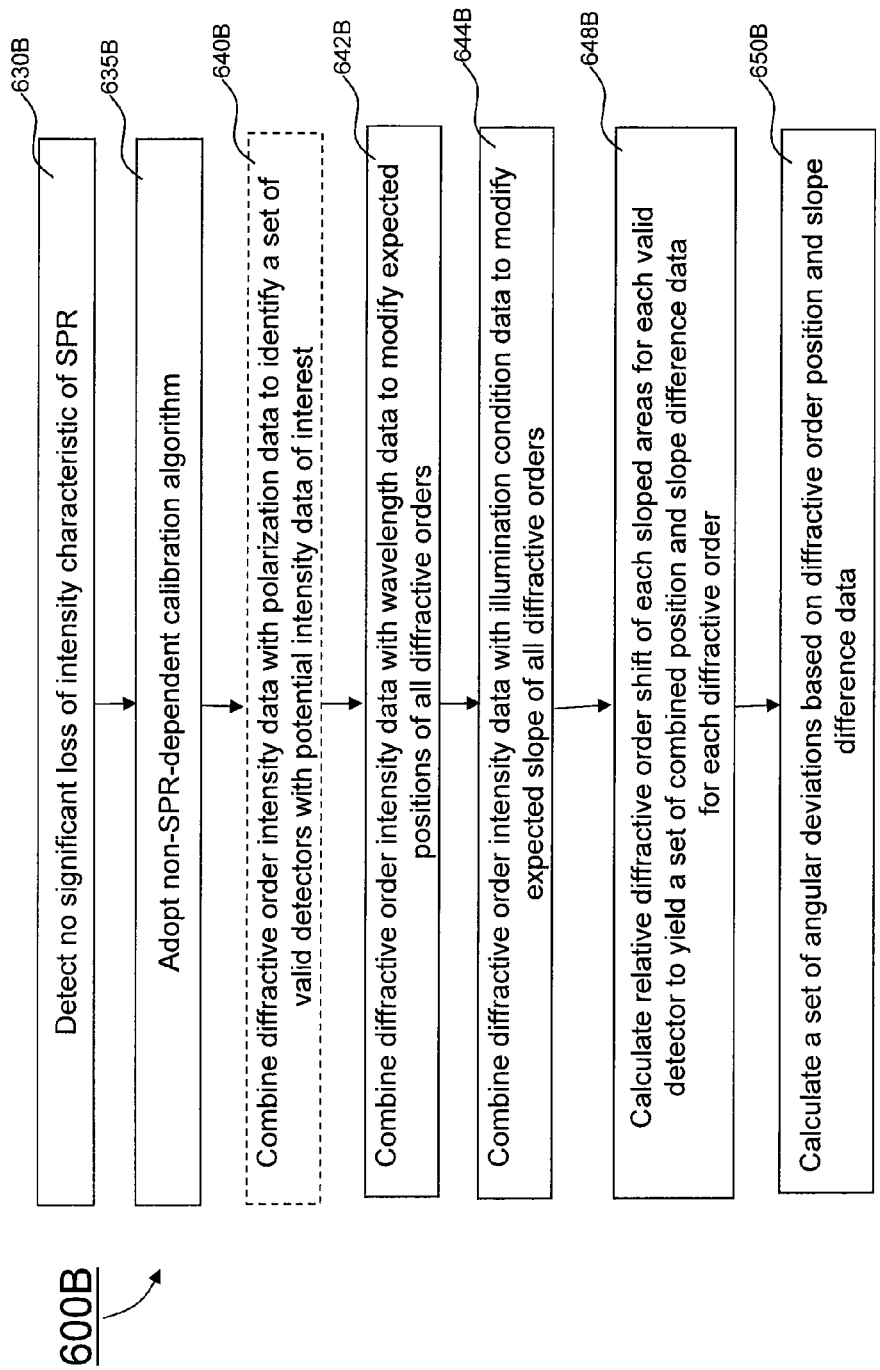

FIGS. 5, 6A and 6B show flowcharts 500, 600A, and 600B, respectively, comprising example steps of methods for performing a beam deviation measurement in a lithographic apparatus. The steps of the flowcharts 500, 600A, and 600B are for illustrative purpose only, and do not have to take place in the order shown. There may be additional intermediate steps that are not shown in the flowcharts 500, 600A, and 600B. Some of the steps may be optional, and/or specific to particular embodiments.

Flowchart 500 shown in FIG. 5 illustrates the main steps of beam deviation measurement, according to embodiments of the present invention.

Flowchart 500 starts with step 510, where a beam of radiation is produced.

In step 515, the beam is passed through an optical system with an aperture, where the aperture directs portions of the beam towards SPR-sensitive grating sensors. Incident light falling on the grating sensors are divided into a number of beams each representing a diffractive order.

In step 520, the diffractive order beams are collected by corresponding detectors.

In step 525, each diffractive order intensity is normalized with respect to a reference intensity. The reference intensity is measured by an energy sensor ES, shown in FIGS. 3 and 4. The normalization is done for each pulse period. It is advantageous to place the ES collection optics and grating sensor collection optics close to each other to minimize polarization state variation within a beam footprint.

In step 530, normalized diffractive order intensity data is analyzed to determine if a characteristic loss of intensity caused by SPR is detected. As discussed above, this loss of intensity is likely to be observed if the beam deviation is small.

In step 535, an appropriate calibration algorithm is adopted based on whether the beam deviation is small or large. Usually deviations greater than 0.001° are considered to be large deviations. As will be discussed with reference to FIGS. 6A and 6B, the calibration algorithm for small deviations is based on shift in expected SPR response in a single order. In contrast, the calibration algorithm for large deviations is based on shifts in position and slope of beam intensity for all diffractive orders.

In step 550, a set of angular deviation data is calculated based on the adopted calibration algorithm. The algorithm takes into account relative diffractive order intensity data from each valid detector in each sensor, and for each time period. Note that in order to calculate angular adjustment values and/or measurement compensators for the beam, GSPPS sensors must be properly aligned with respect to the nominal position of the beam. Thus, any misalignment of the GSPPS sensors should be corrected or pre-calibrated. Specifically for the OML illuminator, this pre-calibration of GSPPS sensors may utilize lateral displacements of the telecentricity control lens, in combination with laser beam pointing control, and measurements of telecentricity. Note that we use the term "pre-calibration" to include any measurement or adjustment that is done at a nominal undeviated position of the beam. Pre-calibration steps are used before the actual beam deviation calibration. Minimization of measured telecentricity leads to best pointing into the GSPPS. Measurements of the laser pulse diffracted images for a set of calibration measurements at and away from the best pointing condition may be analyzed to determine a set of beam deviation calibration data. The beam deviation calibration data provides essentially a set of factors to find the pulse angular deviation as a function of the normalized intensities.

In step 555, the output of the beam deviation calculation is communicated to a user or an automatic controller. The output is used to monitor beam deviation of the lithographic apparatus. If required, components, configurations, and operational parameters of the lithographic apparatus may be corrected or adjusted, as shown in optional step 560. For example, beam steering mirrors may be adjusted to bring the beam back to a nominal position.

3.1 Measurement for Small Angular Deviation

Flowchart 600A illustrates the main steps of a calibration algorithm for smaller beam deviation angles. As discussed above, an SPR-dependent calibration algorithm is appropriate in this case. Subsequent FIGS. 7, 8, and 9 describe this algorithm along with flowchart 600A.

The process starts at step 630A, where a characteristic loss of intensity caused by SPR is detected. The process then proceeds to step 635A, where the SPR-dependent calibration algorithm is adopted.

In step 640A, diffractive order intensity data and polarization data are combined to identify a set of valid detectors with potential SPR-sensitive data at the correct polarization of the illuminating beam. Data from other detectors are not taken into account, because they do not pertain to the correct polarization. This is a pre-calibration step.

In step 642A, diffractive order intensity data and wavelength data are combined to come up with a modified SPR response at a particular wavelength that is expected at nominal beam position. This step is also part of the pre-calibration. This pre-calibration step is done for each valid detector and for each time period.

In step 644A, diffractive order intensity data and illumination condition data are combined to yield a modified SPR response at a particular illumination condition that is expected at nominal beam position. This step is another pre-calibration procedure, and is performed for each valid detector and for each time period.

In step 646A, diffractive order intensity shift data for each valid detector is calculated and individual detector data are combined to yield a combined intensity difference data for each SPR-affected diffractive order. Usually, there is only one SPR-affected diffractive order.

In optional step 648A, a combined intensity difference data for the non-SPR-affected higher orders may be calculated to validate that the beam deviation is indeed within the SPR-affected small-deviation regime.

In step 650A, a set of angular deviation data is calculated based on the calculations of step 646A, and optionally, including the calculations of step 648A.

3.2 Measurement for Large Angular Deviation

Flowchart 600B of FIG. 6B illustrates the main steps of a calibration algorithm for larger beam deviation angles. As discussed above, an SPR-dependent calibration algorithm is not appropriate in this case.

Figure 10:
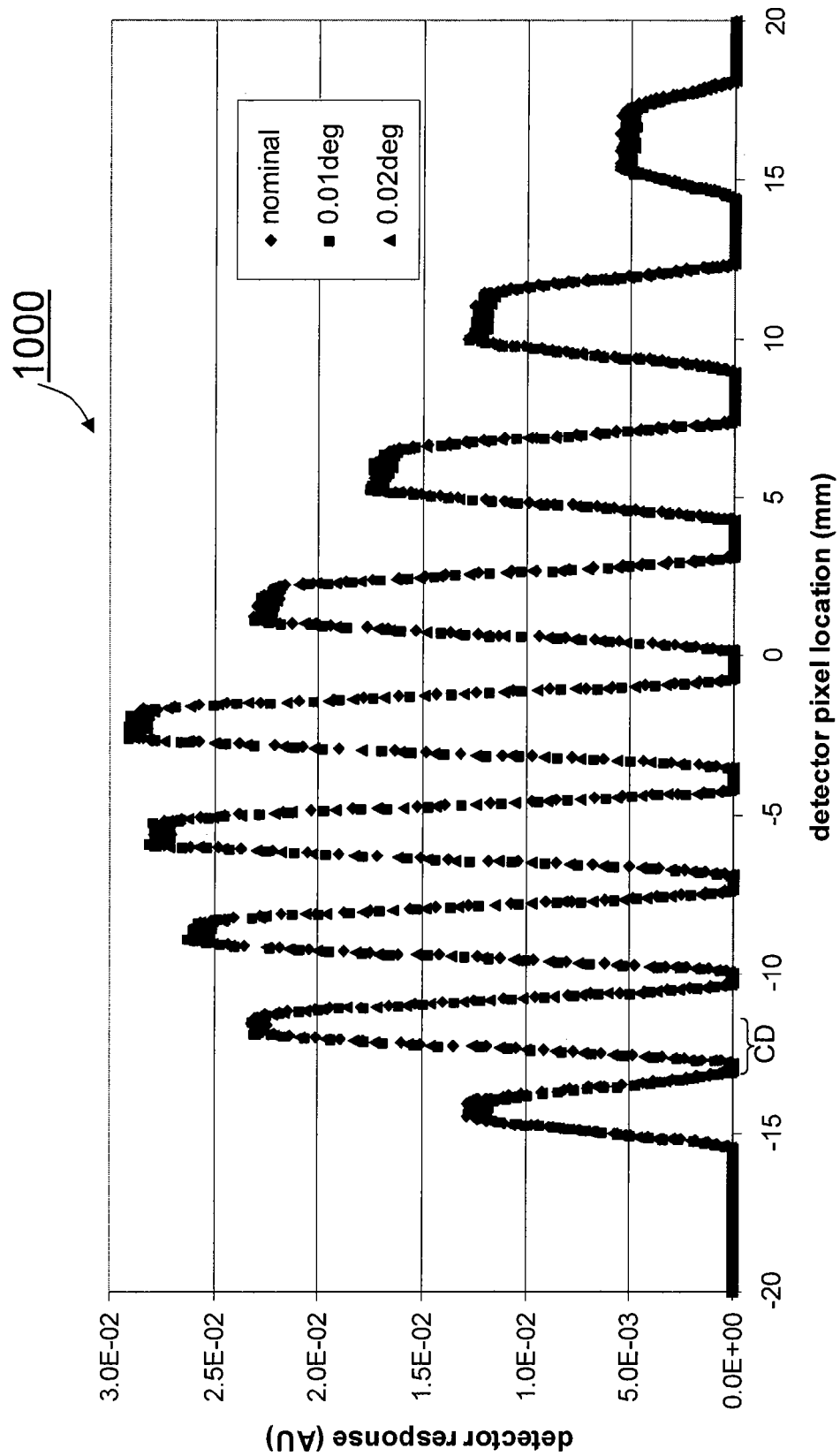
FIG. 10 shows the modeled intensity seen at a particular detector for a 'large' angular beam deviation w.r.t. a non-deviated beam, according to an embodiment of the present invention.
Figure 11:
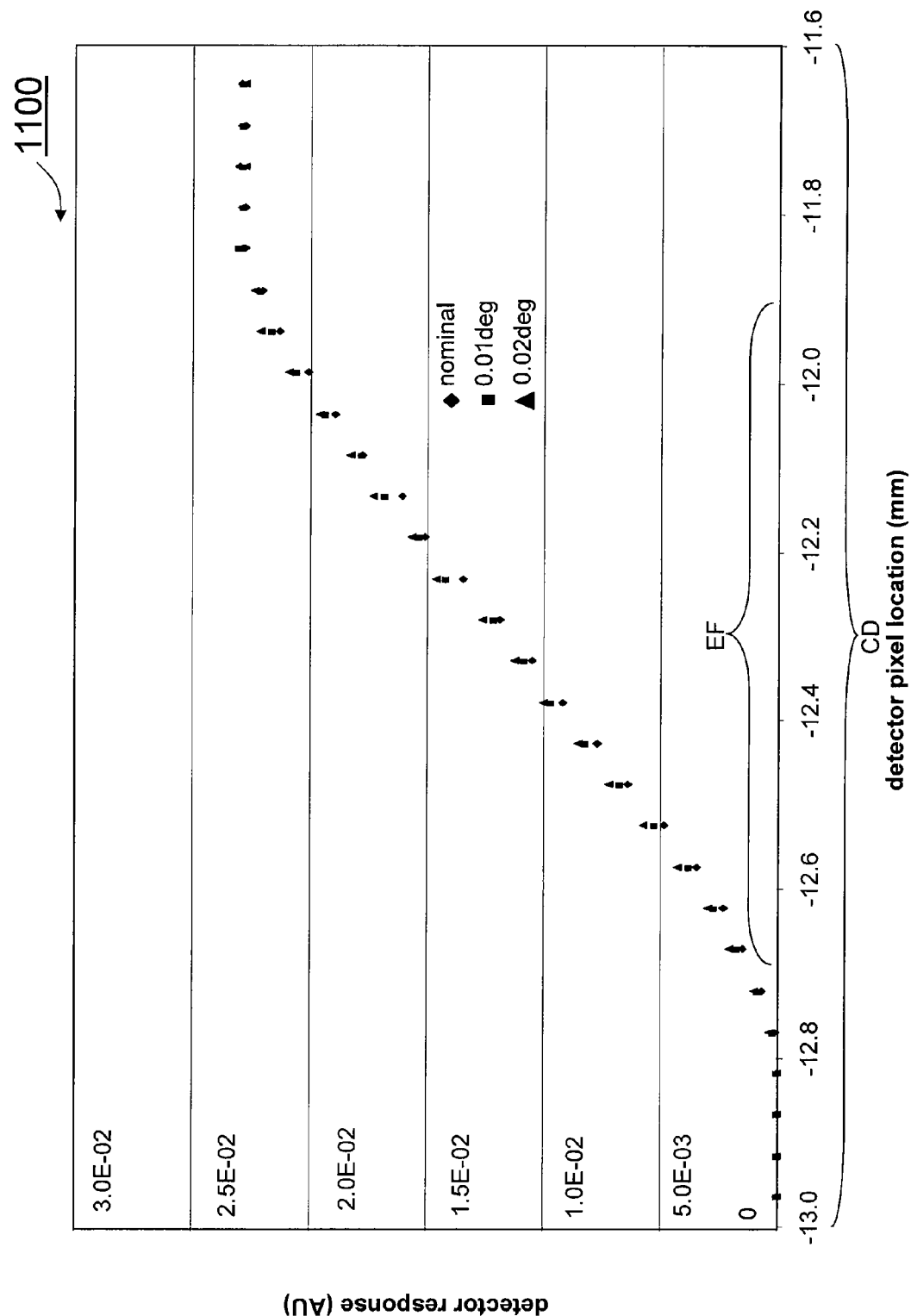
FIG. 11 shows a magnified region of data from FIG. 10 with the details of a representative diffractive order.
Figure 12:
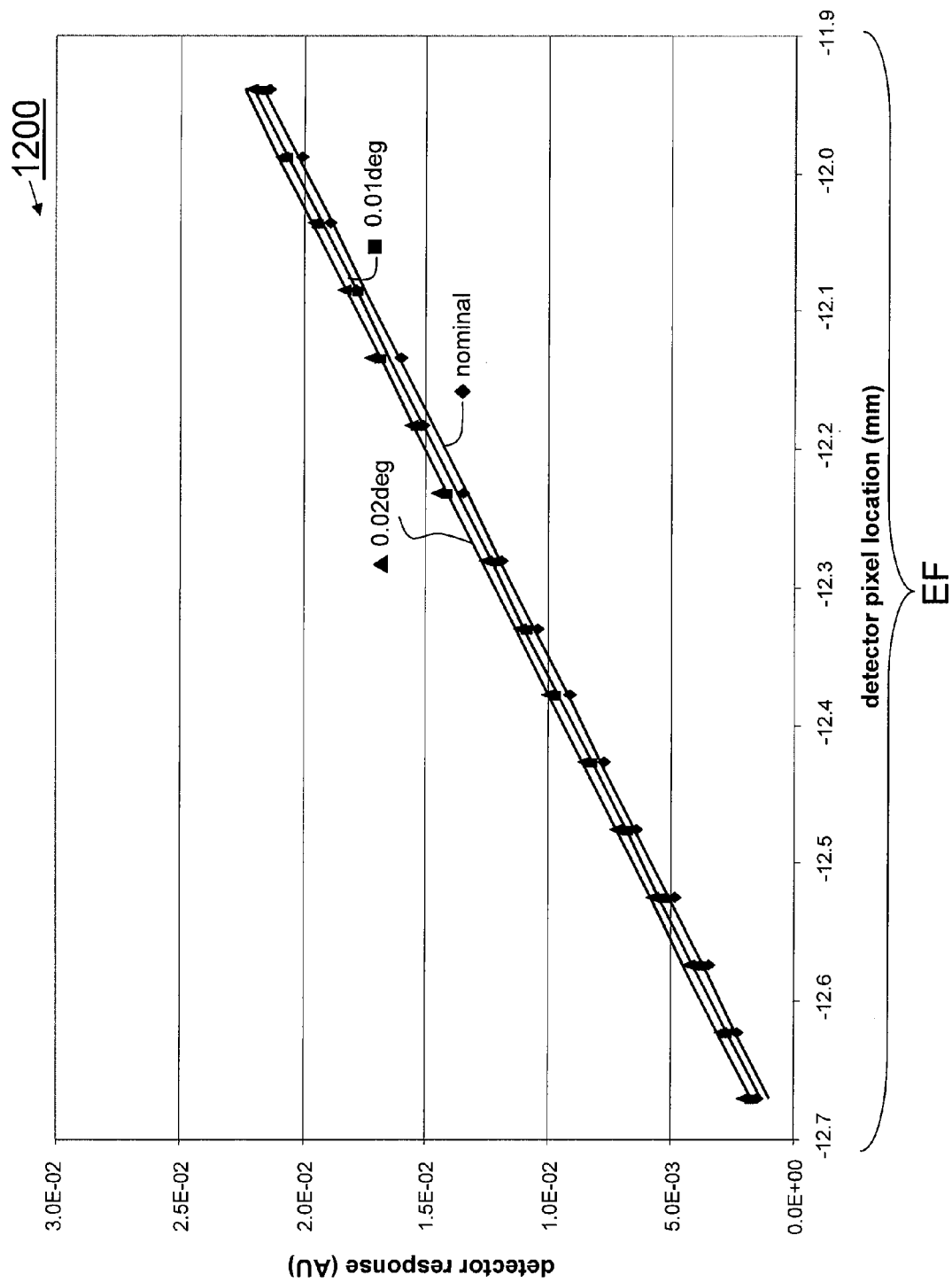
FIG. 12 shows numerical fitting of the data from the representative order from FIG. 11.

The process starts at step 630B, where a characteristic loss of intensity caused by SPR is not detected. The process then proceeds to step 635A, where a non-SPR-dependent calibration algorithm is adopted. FIGS. 10, 11, and 12 describe this algorithm below.

The process may then proceed to an optional step 640B similar to step 640A of flowchart 600A to identify a valid set of detectors that is likely to deliver intensity data of interest with the correct polarization.

In step 642B, diffractive order intensity data and wavelength data are combined to yield a modified diffractive order intensity distribution data at a particular wavelength that is expected at nominal beam position. This step is a part of the pre-calibration. This pre-calibration step is done for each valid detector and for each time period.

In step 644B, diffractive order intensity data and illumination condition data are combined to modify slopes of the diffractive order intensity distribution data at a particular illumination condition that is expected at nominal beam position. This step is yet another pre-calibration procedure, and is performed for each valid detector and for each time period.

In step 648B, diffractive order shifts in each sloped area of the intensity distribution curve are calculated for each valid detector and for each time period.

Individual detector data are combined to yield a combined data for each non-SPR-affected diffractive order position and slope change.

In step 650B, a set of angular deviation data is calculated based on the calculations of step 648A.

3.3 Modeled Calibration Data

FIG. 7-12 show calibration data obtained from a simplified model that includes only one grating (N=1). Optical modeling software Zemax is used for this calculation.

Figure 7:
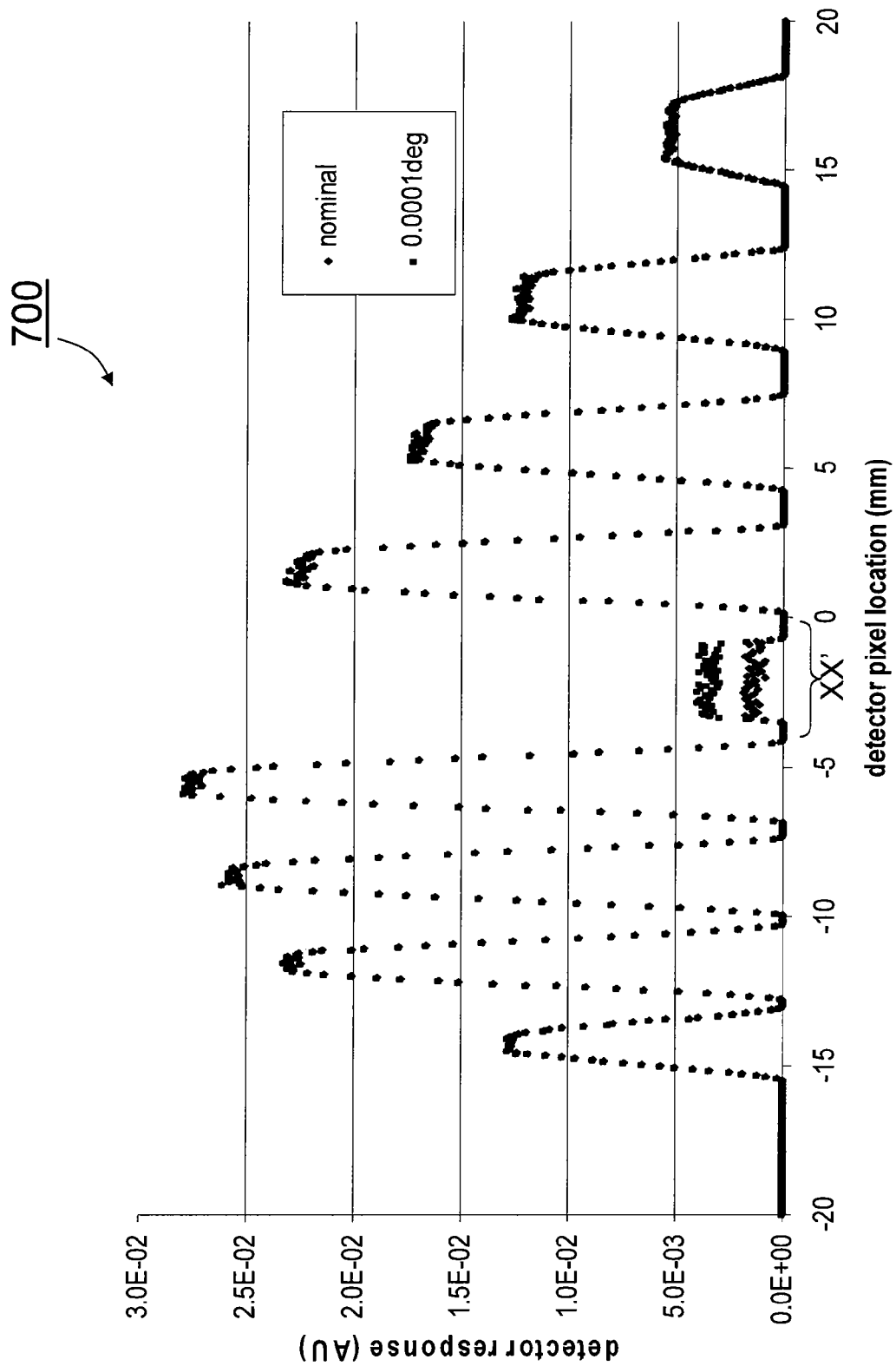
FIG. 7 shows modeled intensity seen at a particular detector for a 'small' angular beam deviation w.r.t. a non-deviated (nominal) beam, according to an embodiment of the present invention.

FIG. 7 shows a graph 700 showing intensity distribution of a set of diffractive order beams as received by a single detector included in a detector set. Detector response is plotted along y axis in arbitrary units, and detector pixel location is plotted along the x axis. Only a single diffractive order beam is affected by the SPR effect, as seen in the sudden drop of intensity within the XX' section along the x axis. Other diffractive order beams are not affected by the SPR effect. Intensity distribution for a non-deviated beam at a nominal position is plotted using diamond-shaped markers, and intensity distribution for a beam deviated by 0.0001° from a nominal position is plotted using square-shaped markers. Though the difference between the diamond-shaped and square-shaped markers is not easily discernable elsewhere in the graph 700, the difference in relative intensity within the SPR regime (within XX') is readily detected in FIG. 7.

Figure 8:
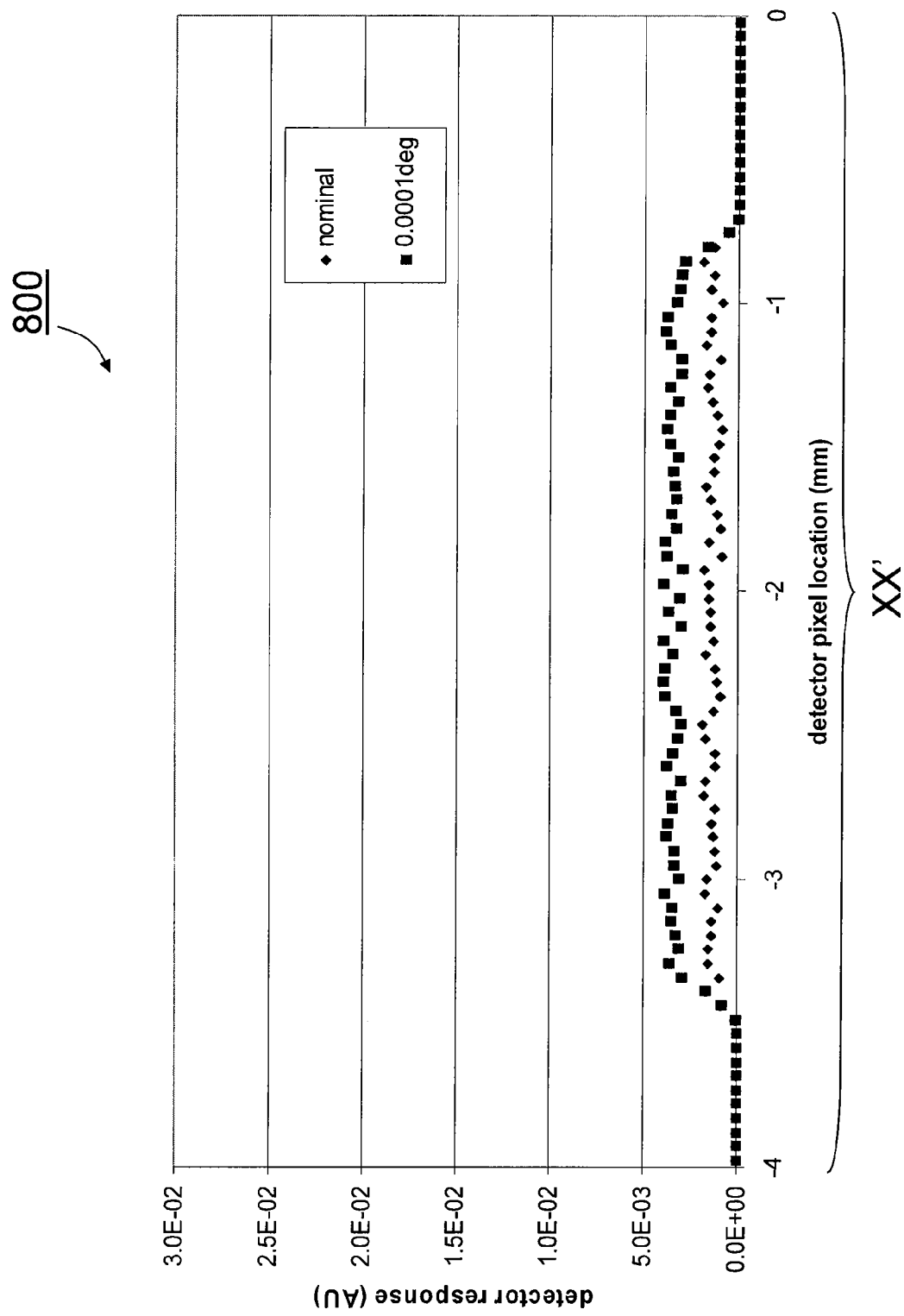
FIG. 8 shows a magnified region of data from FIG. 7 showing details of Surface Plasmon Resonance (SPR)-affected regime.

FIG. 8 shows a magnified view 800 of data from the XX' section along the x axis of FIG. 7, showing the details of the effect of beam deviation on SPR. The deviated beam shows a higher intensity, or in other words, a lower loss of intensity for the SPR-affected diffraction order.

Figure 9:
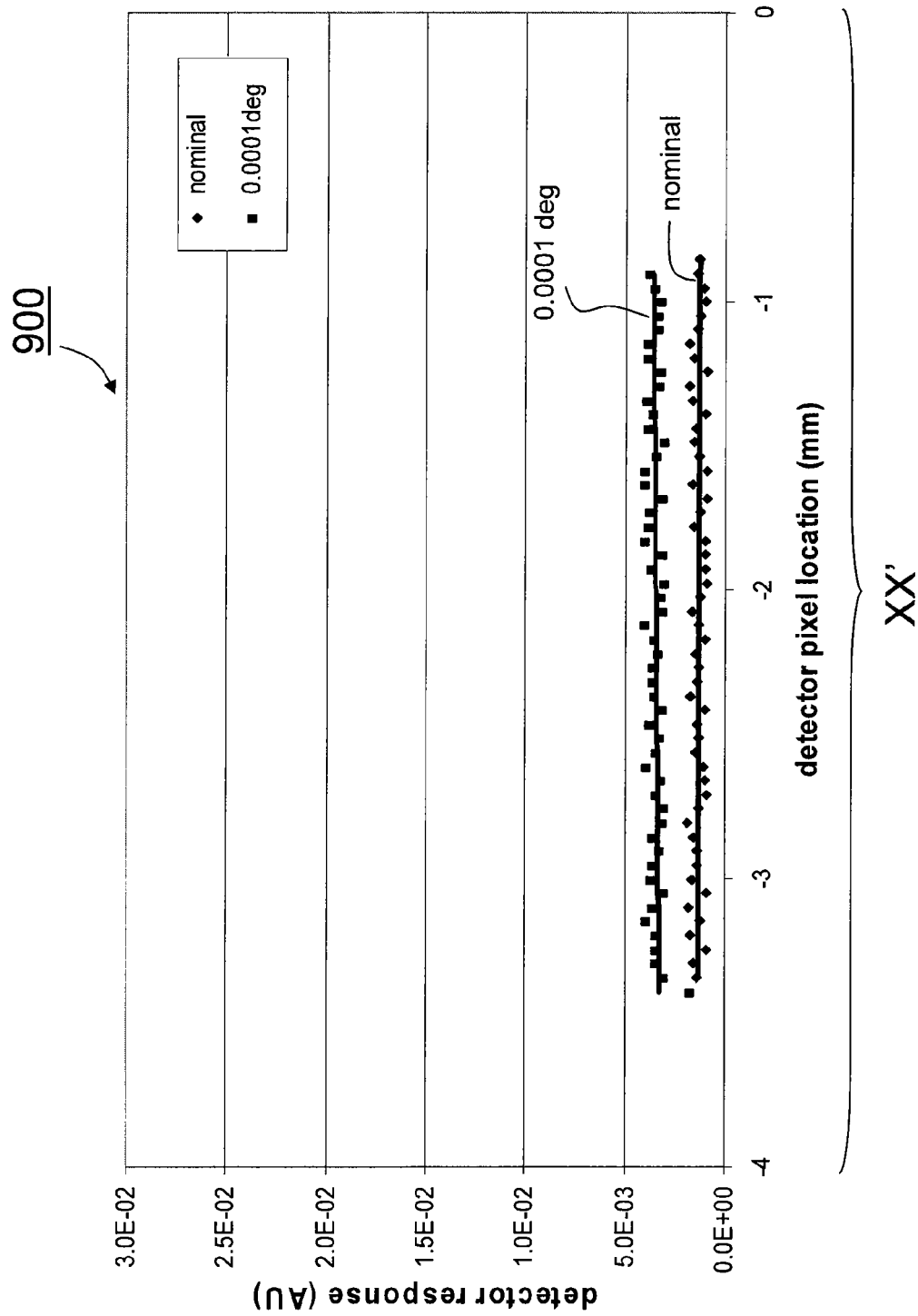
FIG. 9 shows numerical fitting of the data from SPR-affected order from FIG. 8.

Plot 900 in FIG. 9 shows a numerical fitting of the data of the SPR-affected order from FIG. 8.

FIG. 10 shows a graph 1000 showing intensity distribution of a set of diffractive order beams as received by a single detector included in a detector set. Detector response is plotted along y axis in arbitrary units, and detector pixel location is plotted along the x axis. All of the diffractive order beams are affected to some degree when the beam deviation is relatively large, as seen in FIG. 10. No sudden drop of intensity due to SPR effect is detected in this case. Intensity distribution for a non-deviated beam at a nominal position is plotted using diamond-shaped markers. Intensity distribution for a beam deviated by 0.01° from a nominal position is plotted using square-shaped markers, and intensity distribution for a beam deviated by 0.02° from a nominal position is plotted using triangle-shaped markers.

FIG. 11 shows a magnified view 1100 of data from a representative section (denoted as the section CD) along the x axis of FIG. 10, where the position and slope of a diffractive order beam have changed detectably due to the beam deviation.

Plot 1200 in FIG. 12 shows a numerical fitting of the data in a linear section (section EF along the x axis) of a rising slope of a diffractive order. The shifts in the position and slope of the diffractive order beams are the basis of beam deviation calculation when no SPR-effect is observed.

4. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system for measuring angular deviations of a beam of radiation with respect to a nominal position, comprising:
   an illumination system configured to produce the beam of radiation;
   an optical system including an aperture through which at least a portion of the beam of radiation passes to produce an incident beam directed towards a grating sensor, wherein the grating sensor is configured to produce surface plasmon resonance (SPR) effects at a suitable wavelength range of the beam of radiation;
   a set of detection elements, each detection element receiving a portion of a respective beam diffracted from the grating sensor, each diffracted beam corresponding to a diffractive order;
   a transducer coupled to the set of detection elements that normalizes a measured intensity data for each diffractive order with respect to a reference beam intensity measured by a reference energy sensor;
   a processor coupled to the transducer that determines if a characteristic loss of intensity caused by SPR is detected and adopts an appropriate calibration algorithm to quantify angular deviations of the beam of radiation by analyzing normalized intensity data for each diffractive order; and
   an output indicator coupled to the processor that communicates an output to facilitate monitoring and calibration of a lithography tool, wherein the output is generated based on calculated angular deviation data yielded by the calibration algorithm.

2. The system of claim 1, wherein the system comprises N number of aperture holes and N number of grating sensors, wherein each aperture hole produces an incident beam directed towards a respective grating sensor.

3. The system of claim 2, wherein each of the N grating sensors produces M number of diffracted beams directed towards a corresponding P number of detection elements.

4. The system of claim 3, wherein the processor receives normalized intensity data from a total of P×N number of detection elements corresponding to the N number of grating sensors.

5. The system of claim 2, wherein N is an even number, so that N/2 pairs of grating sensors are used.

6. The system of claim 5, wherein a first pair of grating sensors has a complementary second pair of grating sensors rotated (360/N)° from the first pair of grating sensors about a central point.

7. The system of claim 1, further comprising:
   a beam position controller that receives the output from the output indicator and uses data from the output to correct the angular deviation of the beam of radiation.

8. The system of claim 1, wherein the grating sensor comprises reflective grating.

9. The system of claim 1, wherein the grating sensor comprises transmissive grating.

10. The system of claim 1, wherein the grating sensor comprises a truncated cone with concentric grating lines produced around each circumferential slice of the truncated cone.

11. The system of claim 10, wherein the set of detection elements comprises a ring of detection elements surrounding the truncated cone, wherein the truncated cone and the ring of detection elements share a common central axis.

12. The system of claim 1, wherein the aperture comprises an annular opening.

13. The system of claim 1, wherein the grating sensor comprises a substrate and a film on a surface of the grating sensor that receives the incident beam, such that the substrate and film combination is configured to produce SPR effects.

14. The system of claim 13, wherein the substrate is a dielectric.

15. The system of claim 14, wherein the dielectric is silicon dioxide.

16. The system of claim 13, wherein the film is a metal.

17. The system of claim 16, wherein the metal is gold.

18. The system of claim 16, wherein the metal is aluminum.

19. A method for measuring angular deviations of a beam of radiation with respect to a nominal position, comprising:
   producing the beam of radiation;
   positioning an aperture and a grating sensor in an optical path of the beam, such that at least a portion of the beam of radiation, when passed through the aperture, is directed towards the grating sensor, wherein the grating sensor is configured to produce surface plasmon resonance (SPR) effects at a suitable wavelength range of the beam of radiation;
   positioning a set of detection elements such that each detection element receives a portion of a respective beam diffracted from the grating sensor, each diffracted beam corresponding to a diffractive order;
   normalizing a measured intensity data for each diffractive order with respect to a measured reference beam intensity;
   comparing normalized intensity data for each diffractive order with expected SPR response to determine if a characteristic loss of intensity caused by SPR is detected;
   adopting an appropriate calibration algorithm to yield data quantifying angular deviations of the beam of radiation; and
   communicating an output to facilitate monitoring and calibration of a lithography tool, wherein the output is generated based on calculated angular deviation data.

20. The method of claim 19, further comprising:
   correcting a position of the beam of radiation based on the angular deviation data.

21. The method of claim 19, wherein the adoption of calibration algorithm step comprises:
   using intensity data from a single diffraction order when SPR effect is detected; and
   using intensity data from an entire set of diffraction orders when SPR effect is not detected.

* * * * *